United States Patent [19]

Entwistle et al.

[11] Patent Number: 4,725,716
[45] Date of Patent: Feb. 16, 1988

[54] INFRARED APPARATUS FOR INFRARED SOLDERING COMPONENTS ON CIRCUIT BOARDS

[75] Inventors: Stanley D. Entwistle, Nepean, Canada; Timothy Sobolak, Cary, N.C.; George W. R. Goodyear, Raleigh, N.C.; Raymond K. Kelly, Durham, N.C.; Gabriel Marcantonio, Nepean, Canada

[73] Assignee: Northern Telecom Limited, Montreal, Canada

[21] Appl. No.: 827,413

[22] Filed: Feb. 10, 1986

[51] Int. Cl.⁴ .................. H05B 3/62; F27D 11/02
[52] U.S. Cl. ........................ 219/388; 219/405; 219/411; 219/85 BA
[58] Field of Search ............ 219/388, 405, 411, 354, 219/343, 85 BM, 85 BA; 228/43, 46, 180.1, 180.2, 222

[56] References Cited

U.S. PATENT DOCUMENTS

| | | | |
|---|---|---|---|
| 2,674,809 | 4/1954 | Meienhofer | 219/388 |
| 2,820,131 | 1/1958 | Kodama | 219/388 |
| 3,710,069 | 1/1973 | Papadopoulos et al. | 219/85 |
| 3,882,596 | 5/1975 | Kendziora | 228/222 |
| 3,937,388 | 2/1976 | Zimmerman | 228/222 |
| 4,270,260 | 6/1981 | Krueger | 29/403.4 |
| 4,408,400 | 10/1983 | Colapinto | 219/388 |
| 4,436,985 | 3/1984 | Weber | 219/405 |
| 4,481,708 | 11/1984 | Bokil | 219/85 BA |
| 4,603,243 | 7/1986 | Septfons et al. | 219/85 BA |
| 4,632,291 | 12/1986 | Rahn et al. | 228/9 |

FOREIGN PATENT DOCUMENTS 1900591 10/1969 Fed. Rep. of Germany.
3223624 1/1984 Fed. Rep. of Germany.

Primary Examiner—Clifford C. Shaw
Assistant Examiner—Teresa J. Walberg
Attorney, Agent, or Firm—Schwartz, Jeffery, Schwaab, Mack, Blumenthal & Evans

[57] ABSTRACT

In infrared soldering of components onto circuit boards, where components such as leaded components are first soldered on one surface of a circuit board and then additional components are soldered on the other surface, it is a problem that the solder joints of the first arrangement of components may melt during the second soldering step. Also, heat is reflected from the apparatus and can raise the temperature of components above a defined maximum. In the invention, a heat sink is provided for absorbing heat from the infrared heat source when no circuit board is present, and for absorbing heat from components already soldered, during the second soldering step. Usually the infrared heat source is above the path of the circuit boards and the heat sink is below the path of, and not in contact with, the circuit boards.

7 Claims, 6 Drawing Figures

INFRARED APPARATUS FOR INFRARED SOLDERING COMPONENTS ON CIRCUIT BOARDS

BACKGROUND

1. Field Of The Invention

This invention relates to the infrared soldering of components on circuit boards by infrared radiation, and in particular to the infrared soldering of surface mounted components. More specifically, the invention is concerned with the infrared soldering of components, and in particular surface mounted components, on one surface of a circuit board after other components have been mounted on the other surface of the circuit board.

2. Related Art

Circuit boards very frequently have components on both surfaces of the board. Thus, for example, a circuit pattern will be formed on one surface, with contact pads at various positions. Holes are provided through the board, aligned with some of the pads. In a first step, leaded components are mounted on the surface remote from the circuit pattern via leads passed through the holes and soldered to pads. Such soldering is usually done by wave soldering, although other forms of soldering can be used. Following soldering of the leads, in a further step, other components, and in particular surface mounting components, are mounted on the surface of the board on which is formed the circuit pattern. The soldering of these other components is performed by various methods, one of which is by infrared irradiation.

A basic problem relating to the soldering of the components in the further step is obtaining satisfactory fusion or melting of the solder paste while at the same time avoiding melting of other solder joints, such as the solder attaching leaded components, which will be hanging down from what would be the lower surface of the board when the surface mounting components are being soldered. Even if a solder of lower melting point is used in the second step, for the surface mounted and any other components, a fully satisfactory solution is not achieved.

A further problem is that during heating of a circuit board prior to soldering the other components, the previously soldered components can be heated to a temperature which can cause malfunction of the components or lead to a reduced operating life.

Various other problems exist in the process of mounting surface mounted components on boards to which other components have been mounted.

SUMMARY

The present invention provides an infrared soldering system in which the circuit boards are maintained below the temperature normally attained by positioning a heat sink in one or more of the various heating zones, for example, the preheat zone, heat stabilizing zone, and high temperature soldering zone. The heat sink removes heat which otherwise would build up in spaces normally shielded by the circuit boards due to the infrared radiation heating such zones when boards are not in position. It is possible to produce a very high temperature in the joints to be soldred while maintaining the other joints at lower temperatures. Also, previously mounted components are kept at a lower temperature.

BRIEF DESCRIPTION OF THE DRAWING

The invention will be readily understood by the following description of certain embodiments, by way of example, in conjunction with the accompanying drawings, in which.

DETAILED DESCRIPTION OF THE INVENTION

Figure 1:
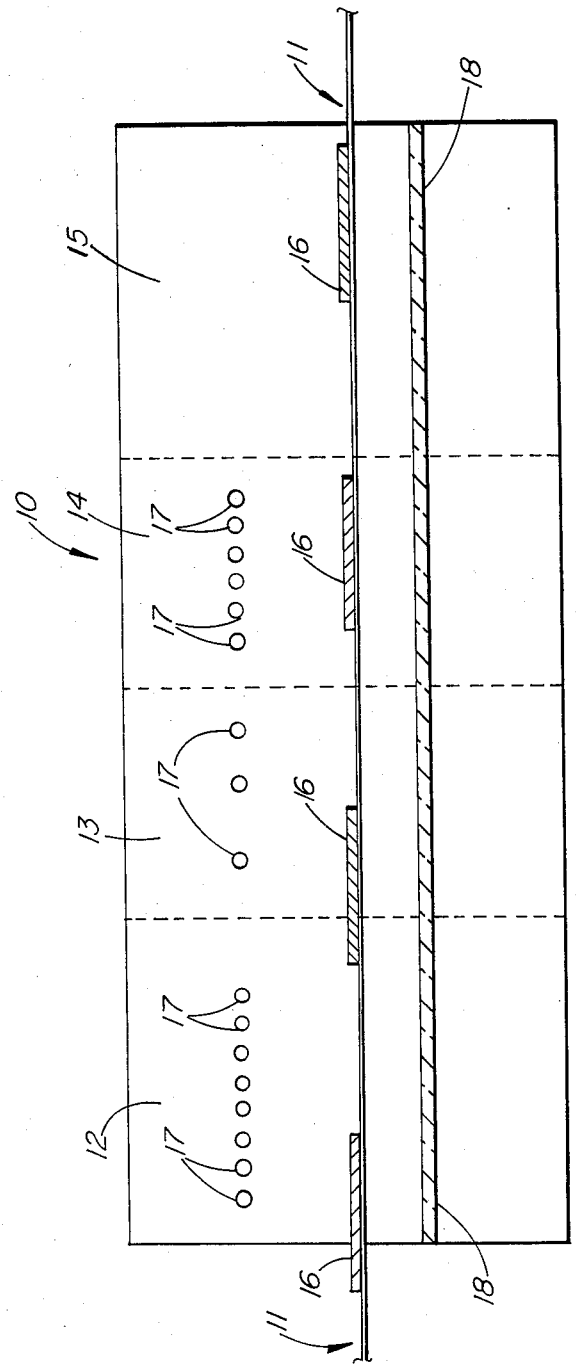
FIG. 1 is a diagrammatic cross-section along a typical infrared heating furnace.

FIG. 1 illustrates an infrared (IR) furnace 10 through which passes a conveyor 11. The furnace, in the particular example, has four zones, a preheat zone 12, a heat stabilizing zone 13, a heat "spike" zone 14 and a cooling zone 15. Circuit boards 16 are carried through the furnace 10 on the conveyor 11. Normally, the conveyor 11 comprises two parallel spaced apart belts or similar members which support the circuit boards 16 at their side edges, with components on the undersurface of a board projecting down between the belts. Heating of the boards is by IR radiation from IR lamps 17.

The boards 16, on the conveyor 11, pass initially through the preheat zone 12, then the heat stabilizing zone 13. An intense level of heating occurs in the main heating zone 14, for a relatively short time, in order to fuse the solder paste which has been deposited on the board. The IR lamps 17 in the main heating zone 14 create a "spike" of heat at about midpoint along the zone 14. The effect in zone 14 is to rapidly raise the heat to a high temperature for a short period on time. Typically, the maximum temperature is of the order of 188° C. (370° F.).

The heat output from the lamps 17 is high in the preheat zone. In the stabilizing zone the heat output is relatively low. In the stabilizing zone the temperature of some components and parts decreases while the temperature of the remaining components rises, to a low maximum. This enables thermal shock to be avoided for critical components and other parts and also gives time for the solder flux to activate and for the volatiles to be driven off. The low maximum temperature is controlled due to the susceptibility of the components to damage. Even though the final heating, in zone 14, is rapid and concentrated, it is still possible that melting of previously soldered joints can occur. Also, some components can reach undesirable temperatures.

The situation is made worse by the fact that the lamps 17 operate continuously, but the circuit boards are spaced apart along the conveyor, with gaps between them. Thus the energy from the IR lamps, particularly in zone 14, tends to heat up furnace members below the belts 11, for example, a ceramic heat shield 18 positioned beneath the boards. This heat is redirected back to the undersurface of the boards as they pass through. Thus the boards and components are likely to be heated above an initial temperature.

Figure 2:
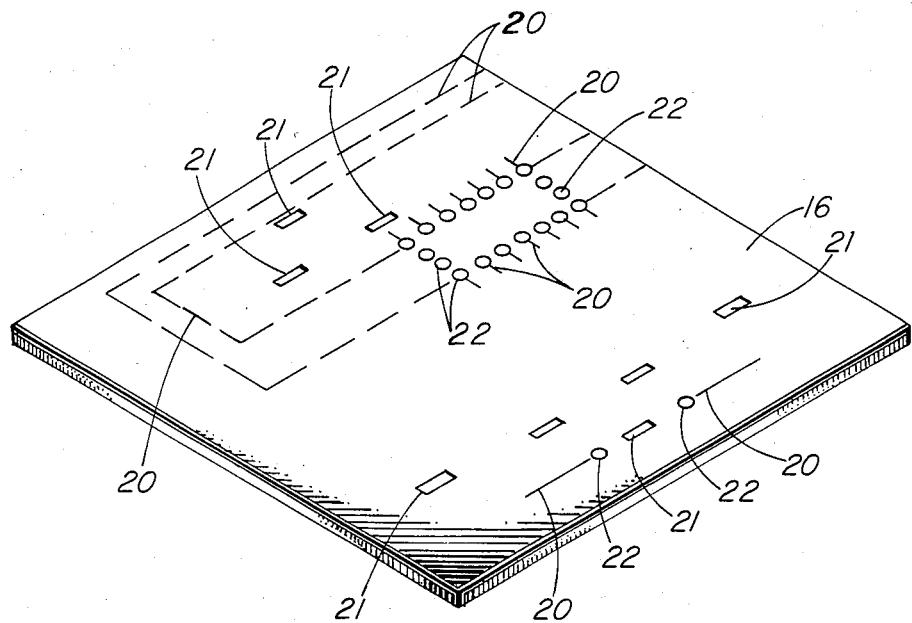
FIGS. 2 and 3 are diagrammatic perspective views on the two surfaces of a circuit board.
Figure 3:
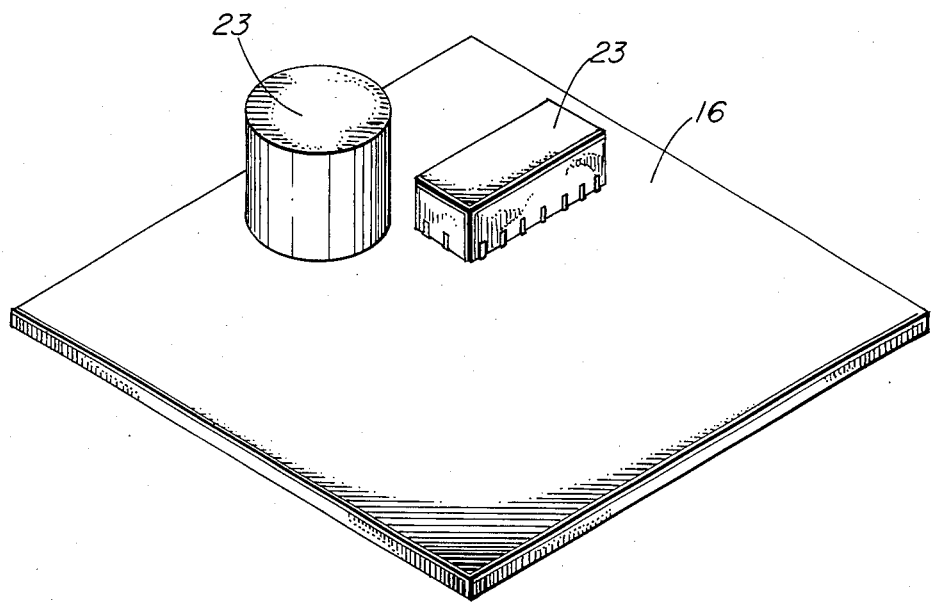

FIGS. 2 and 3 illustrate very diagrammatically both surfaces of a circuit board 16. On one surface a circuit pattern is formed, indicated generally at 20. In FIG. 2, a small number of surface mounted components are shown at 21. Also seen in FIG. 2 are holes 22 through the circuit board. Leads from components on the other surface extend through the holes 22 and are soldered to the circuit pattern 20.

FIG. 3 shows two leaded components 23 mounted on the board 16, on the other surface to that shown in FIG. 2. The leads of the components pass through holes in the circuit board as shown at 22 in FIG. 2. Generally, other leaded components (not shown) are mounted on the surface shown in FIG. 3.

It will be appreciated that it is imperative that the solder joints between the leaded components 23 and the circuit pattern 20 do not become molten during soldering of the surface mounted components 21. If the solder does melt, the components 23 are likely to fall off. At the same time, it is necessary to heat the proposed solder joints between the surface mounted components and the circuit pattern to as high a temperature as possible. If the temperature is too low then no fusion occurs at all. Solder paste is normally applied to contact areas on the circuit pattern and the temperature to which the paste is heated must be sufficient to activate the flux included in the paste, and also to melt the solder. At an intermediate temperature there is a sintering of the solder paste which, depending upon circumstances, may or may not give an acceptable joint. Furthermore, unless a certain minimal temperature is achieved, the activity of the flux is reduced and certain volatile components may not be driven off. This can result in unsatisfactory joints.

Thus there is a sitution in which compromises and "trade-offs" must be made. If a lower melting point solder is used for the surface mounting components, certain problems arise. Firstly, in operation, some of the surface mounted components can experience temperatures which can cause a chemical interaction between the solder and the components, partly because of additives used to lower the melting point. Another problem is that the solder may soften or partially melt, allowing movement of a component. Also, even though the solder may melt during the IR heating, a lower preheat temperature may not result in good activity of the flux in the solder. Flux activity can be doubled by a 10° C. rise in temperature. Also, it is necessary to drive off the volatiles from the solder paste before fusion in order to avoid splatter and the like. The volatiles may not be properly driven off at a low temperature. Finally, in spite of the various difficulties, it was found that the temperature differential was still insufficient to guarantee that leaded components would not become unsoldered, or alternatively, poor quality solder joints for surface mounted components occurred.

The present invention proposes a substantial change in the hitherto standard process. Instead of bringing all of the circuit board and components up to a stable preheat, it is arranged that heat is abstracted below the conveyor level in the furnace to maintain a lower temperature for previously soldered components, for example, leaded components. Particularly, it is arranged that heat be abstracted below the conveyor or belt level in the solder melt zone, zone 14 in FIG. 1.

Figure 4:
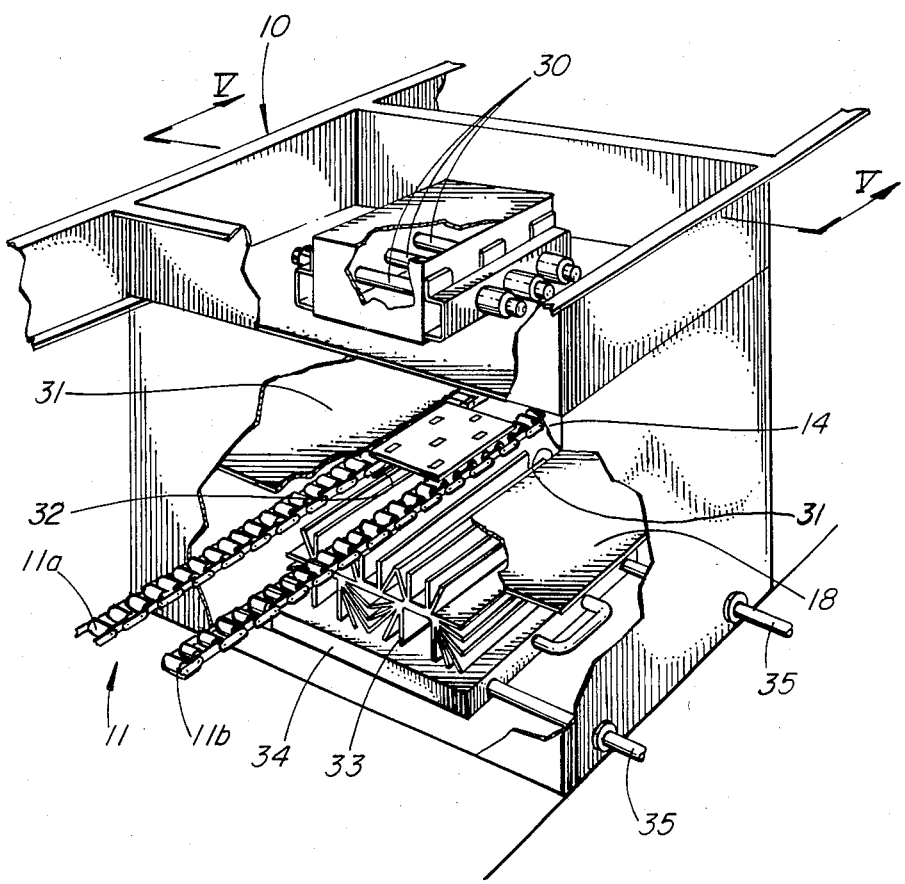
FIG. 4 is a perspective view, partly sectioned, illustrating a heating zone of a furnace, in accordance with the present invention.
Figure 5:
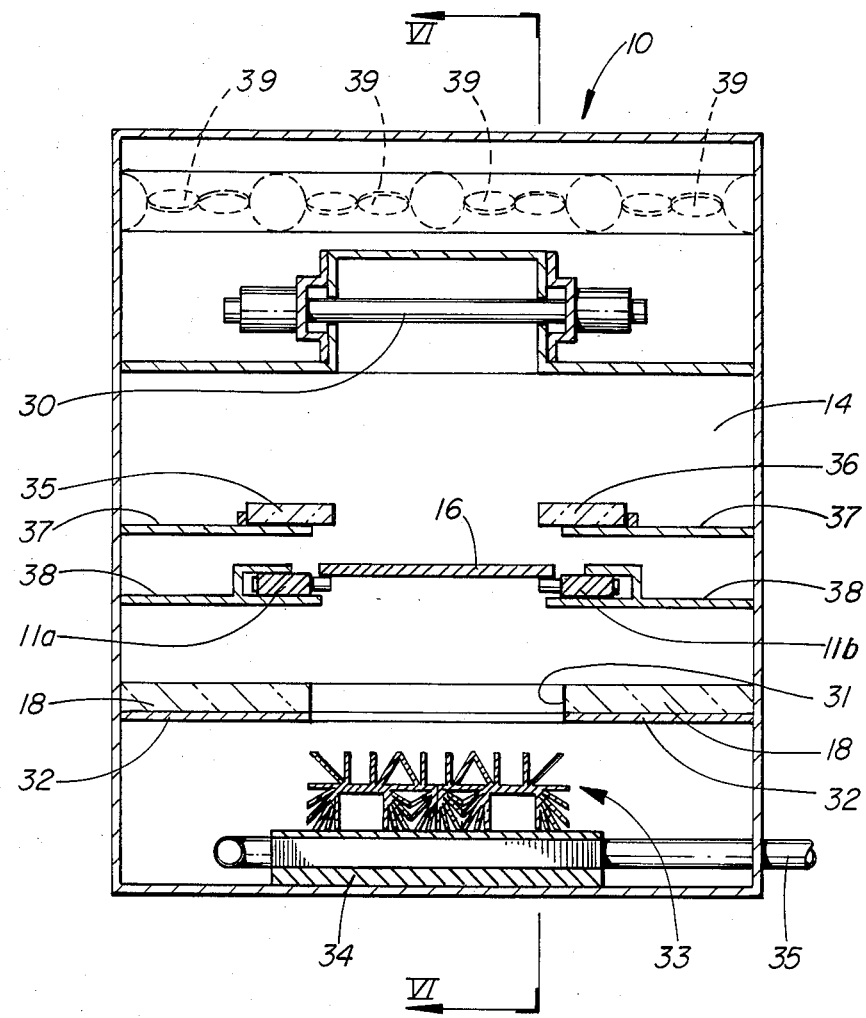
FIG. 5 is a cross-section generally on the line V-V of FIG. 4.

FIGS. 4 and 5 illustrate the solder melt zone in a furnace, in accordance with the present invention, FIG. 4 being a perspective with parts omitted to show detail, and FIG. 5 being a cross-section. The preheat and stabilizing zones—zones 12 and 13 in FIG. 1—have been omitted so that details of the melt zone—zone 14 in FIG. 1—can be seen. The cooling zone 15 has also been omitted. The IR lamps are shown at 30. In the example, three lamps are provided extending transverse to the direction of travel of the circuit boards. The conveyor 11 is shown, composed of two parallel spaced link belts 11a and 11b. The refractor member 18 extends across the chamber, spaced down from the belts 11a and 11b, the refractory member having a window 31 therein. The refractory member 18 is supported by a metal sheet 32, shown in FIG. 5.

Beneath the refractory member is a heat sink 33 mounted on a cooling plate 34. The heat sink is composed of a finned body of heat absorbent material, for example aluminum, and the cooling plate 34 is made of, for example, copper. In a particular example, the plate 34 is hollow and is cooled by a cooling fluid fed therethrough via tubes 35. The window 32 is necessary for two reasons. If the refractory member extended across the chamber unbroken, it would be heated, by the IR radiation from bulbs when not shielded by a circuit board. When a board passes through, this heat would be radiated back against the undersurface of the circuit board and against the components thereon, as described above in conjunction with FIG. 1. The window permits the IR radiation to pass through and the energy is absorbed by the heat sink 33 and transferred to the cooling member 34 and then to the cooling fluid, if provided. On passage of a circuit board over the window, the heat sink will abstract heat from the components mounted on the lower surface. This will maintain these components at a lower temperature than that which normally occurs. Also, the circuit board itself is at a lower temperature. In addition, fans 39 are provided for forcing air through the zone. To protect the exposed parts of the conveyor 11, heat shields 36 are provided, resting on shelves 37, so as to shield link belts 11a and 11b. The belts 11a and 11b are supported in guides 38.

Figure 6:
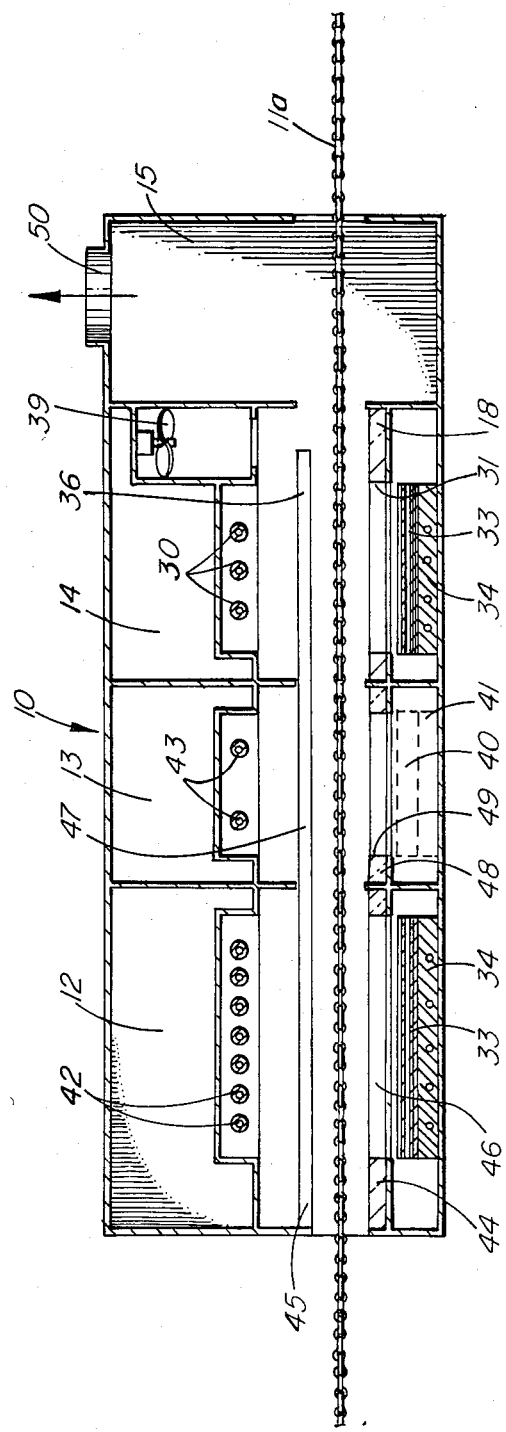
FIG. 6 is a longitudinal cross-section, similar to that of FIG. 1, illustrating a furnace embodying the invention.

It is also proposed that a similar provision of heat sinks be provided for the preheat zone 12 and also the heat stabilizing zone 13. FIG. 6 is a longitudinal cross-section through a furnace incorporating heat sinks 33, 34 in the preheat zone 12 and in the soldering zone 14. Also indicated in dotted outline are heat sinks 40, 41 in the heat stabilizing zone 13. Heat sinks 40, 41 may or may not be provided, depending upon requirements and accessability.

In FIG. 6, a plurality of IR lamps 42 are provided in the preheat zone 12, while two lamps 43 are shown in the stabilizing zone 13. The number of lamps may vary, depending upon requirements. In the preheat zone, a ceramic member 44 is shown and also ceramic shields 45 are provided. A window 46 is provided in ceramic member 44.

In the stabilizing zone 13, ceramic shields 47 are provided, to protect the belts 11a and 11b. A ceramic member 48 is provided below the link belts and a window 49 may or may not be provided in the ceramic member 48. Cooling air passes through the fans 39, issuing into the cooling zone 15. From here the air exhausts through an outlet 50.

The final heating in zone 14 is normally arranged to give a high peak or "spike". The temperature at the solder joints for the surface mounting components can be as high as about 460° F. (238° C.). This is assisted by the fact tha the shiny joints of previously soldered joints of the leaded components do not absorb heat from the IR as quickly as the duller solder paste. Thus the solder paste heats more quickly than the already soldered joints. Further, because the leaded components are cooled, heat is abstracted from the already soldered joints. As a result, although the solder paste is heated to a higher temperature, giving a very fluid melt to the solder with a resulting highly effective joint, the previously soldered joints are maintained below any temperature which will have an adverse effect on the joints.

The ability to heat the solder paste to a higher temperature provides a considerable advantage. In addition to giving a higher degree of fluidity to the molten solder paste, variation in temperature over a circuit board can more readily be accepted. It is always a possibility that the temperature at individual joints will vary from a norm or average. This will occur both in the joints to be made—the solder paste—and in the previously soldered joints. The actual difference between the hottest previously soldered joint and coolest new joint can be small, with the associated problems. By the ability to raise the temperature of the new joints—of solder paste—temperature variations become less problematic.

With the ability to maintain components on one surface of a circuit board below the critical temperature, while heating solder joints for components on another surface to a higher temperature than is conventional, other features become possible. Thus it is possible to solder surface mounted components on both sides of a circuit board. Surface mounted components are usually very small, and relatively lightweight. It is possible to hold them in place with a solder paste/flux even when inverted.

In one process, there are two soldering positions spaced apart along a furnace. At the first position, the lower surface of a circuit board is irradiated by IR lamps and the solder paste melted to solder the components onto the board. A heat sink and cooling member can be positioned in the upper part of the furnace to keep the upper surface cool, if desired. At the second soldering position, the upper surface is irradiated by IR lamps to melt the solder paste and solder the components in position. A heat sink and cooling member is mounted below the boards to keep the lower surface and components cool.

In another process, the upper surface is first heated to solder the components on the upper surface, the lower surface and components thereon being kept cool by a heat sink and cooling member. The board is then turned over and the new upper surface heated to solder the components thereon. The previously soldered components, now on the lower surface, are kept cool by a heat sink and cooling member. In both examples, preheat, heat stabilizing, soldering and cooling zones are usually provided for each soldering position.

It is also an advantage that, with properly designed solder pads on the circuit pattern on the circuit board, good fluidity of the solder provides improved alignment of components on the board. If components are slightly misplaced, the surface tension of the liquid solder will pull the components into alignment.

The furnaces illustrated, particularly in FIGS. 4 and 5, are generalized furnaces capable of processing circuit boards of various widths by varying the spacing of the belts 11. In an arrangement specifically designed for a single board width, or for a limited range of board widths, the furnace can be much narrower than that illustrated in FIGS. 4 and 5. Also, the vertical spacing of the various items, such as belts 11 and ceramic member 18 can be closer, enabling the heat sinks to be closer to the circuit board. Use of the invention enables the attachment of components to the board, on the side of the board remote from surface mounting components, prior to soldering the surface mounted components which previously were added afterwards. For example, a leaded relay can be soldered in position prior to soldering surface mounted components and not be damaged. The normal limit on such a relay is a maximum temperature of 120° C. for one minute. The use of heat sinks enables this requirement to be met in spite of a higher soldering temperature for the surface mounting components than previously permitted.

While the invention has been particularly described with relation to the soldering of surface mounted components onto a surface of a circuit board on which other components have been soldered onto the other surface, the invention is not restricted to this. The invention can be used whenever it is desired to carry out a further soldering step on a circuit board after components have already been soldered on the board, and where it is necesary to avoid melting solder joints already made, or it is necessary to prevent previously soldered components reaching a temperature which can adversely affect the components, or both of these requirements.

Fans can also be provided, in zones 12 and 13, to blow air from one zone, i.e. zone 12, to another zone, i.e. zone 14.

What is claimed is:

1. Apparatus for the infrared soldering of components on circuit boards, comprising:
   a furnace;
   conveyor means passing through said furnace, said conveyor means including two conveyor members spaced apart to support circuit boards at their opposite edges;
   infrared radiation means mounted on one side of said conveyor means;
   a heat sink mounted on the other side of said conveyor means, said heat sink including a finned body of heat absorbent material and a cooling plate, said finned body positioned on said cooling plate between said infrared radiation means and said cooling plate;
   whereby said heat sink abstracts heat from a surface of a circuit board remote from said infrared radiation means and also from any components mounted on said surface.

2. Apparatus as claimed in claim 1, said cooling plate of hollow construction and including means for circulating a cooling fluid through said plate.

3. Apparatus as claimed in claim 1, including a heat shield mounted on said other side of said conveyor means and a window in said heat shield, said heat sink being aligned with said window.

4. Apparatus as claimed in claim 3, said heat shield mounted between said conveyor means and said heat sink.

5. Apparatus as claimed in claim 1, including heat shields fixedly mounted between said infrared radiation means and said conveyor means to shield said conveyor members from infrared radiation.

6. Apparatus for the infrared soldering of surface mounted components on a top surface of a circuit board, comprising:
   a furnace having a preheat zone, a heat stabilizing zone, a soldering zone and a cooling zone, in sequence;

conveyor means passing through said furnace, said conveyor means including two conveyor members spaced apart to support circuit boards at their opposite edges;

infrared radiation means in each of said preheat, heat stabilization and soldering zones, positioned above said conveyor means;

a heat sink mounted in at least said soldering zone below said conveyor means, said heat sink comprising a finned heat absorbing member mounted on a cooling plate; whereby said heat sink abstracts heat from the bottom surfaces of said circuit boards and from any components mounted on said bottom surfaces.

7. Apparatus as claimed in claim 6, said cooling plate being hollow, and including means for circulating a cooling fluid through said cooling plate.

* * * * *